United States Patent [19]
Roane et al.

[11] Patent Number: 5,498,906
[45] Date of Patent: Mar. 12, 1996

[54] CAPACITIVE COUPLING CONFIGURATION FOR AN INTERGRATED CIRCUIT PACKAGE

[75] Inventors: Jerry M. Roane; Carmen D. Burns, both of Austin, Tex.

[73] Assignee: Staktek Corporation, Austin, Tex.

[21] Appl. No.: 153,511

[22] Filed: Nov. 17, 1993

[51] Int. Cl.⁶ .............................. H01L 23/02; H01L 23/34
[52] U.S. Cl. .......................... 257/724; 257/680; 257/686; 257/723
[58] Field of Search .................................. 257/924, 904, 257/685, 686, 723, 668, 724, 595, 603, 925, 926, 774, 776, 680, 684, 703

[56] References Cited

U.S. PATENT DOCUMENTS

| | | | |
|---|---|---|---|
| 4,562,315 | 12/1985 | Aufderheide | 361/288 |
| 4,598,307 | 7/1986 | Wakabayashi et al. | 257/703 |
| 4,780,795 | 10/1988 | Mienel | 257/703 |
| 5,008,734 | 4/1991 | Dutta et al. | 257/700 |
| 5,117,282 | 5/1992 | Salatino | 257/686 |
| 5,281,846 | 1/1994 | Kaiser | 257/676 |
| 5,311,057 | 5/1994 | McShane | 257/676 |

FOREIGN PATENT DOCUMENTS 4199565  7/1992  Japan ...................... 257/924

Primary Examiner—Sara W. Crane
Assistant Examiner—Jhihan Clark
Attorney, Agent, or Firm—Fulbright & Jaworski

[57] ABSTRACT

The present invention provides capacitive and/or power supply decoupling for an integrated circuit package by utilizing an externally mounted bypass capacitor between power and ground. The bypass capacitor is mounted on internal leads projecting into a cove area formed at one or both ends of an integrated circuit package whereby one such internal lead is connected to the external power lead and the other such internal lead is connected to the external ground lead. A flexible, high-temperature adhesive material is used to secure the capacitor to the internal leads in the cove of the IC package so that when the package is later subject to soldering temperature thereby softening the solder connections between internal leads and the capacitor, the capacitor will not be electrically or physically disconnected from the internal leads. The adhesive secures the capacitor in place until the high temperatures dissipate and the solder joints between capacitor and the internal leads harden. A second cove formed at the opposite end of the integrated circuit package allows integrated circuit packages to be stacked alternately, one on top of another, so the cove portion of each integrated circuit package provides clearance for the capacitor mounted immediately above or below each respective stacked integrated circuit package. In this manner, an ultra high density integrated circuit package comprising stacked discrete integrated circuit packages can be formed and capacitively decoupled.

37 Claims, 8 Drawing Sheets

CAPACITIVE COUPLING CONFIGURATION FOR AN INTERGRATED CIRCUIT PACKAGE

SPECIFICATION

Background of the Invention

1. Field of the Invention

The present invention relates to apparatus for eliminating inductively induced delay associated with the packaging of integrated circuit devices. More specifically, this invention involves the use of a bypass capacitor externally mounted within an aperture formed in the casing of an encapsulated integrated circuit device, where a plurality of these individual integrated circuit devices can be stacked to form a high density integrated circuit package.

2. Discussion of Related Art

Using a bypass, or balancing, capacitor with an integrated circuit (IC) device to reduce power supply transients, ground bounce and high frequency inductive delay is known in the art. In the prior art, a bypass, or balancing capacitor, has sometimes been mounted externally above or below the IC package, or on a circuit board adjacent the IC package, with one capacitor pole electrically connected to $V_{cc}$ with the other pole coupled to $V_{ss}$ at the external leads or pin-outs for the integrated circuit. This type of configuration is problematic because integrated circuit devices with an external capacitor mounted in this manner cannot be easily stacked to form a high density integrated circuit package. A bypass capacitor situated on the top or bottom surface of an IC device interferes with and hinders the packaging of the IC device. Furthermore, providing the bypass or decoupling capacitor at the external leads does not maximize the desired decoupling effect.

SUMMARY OF THE INVENTION

The present invention solves the stackability problem in the prior art by mounting the capacitor or capacitors within an aperture, or cove, in one or both ends of an IC package. The desired decoupling effect is improved by electrically connecting the capacitor(s) to IC power and ground, i.e. $V_{cc}$ and $V_{ss}$, at points on the lead frame that are electrically close to the integrated circuit die. Conductors for this purpose are routed directly through the IC package and extend into the cove area as internal leads. These leads are formed so as to provide support for the capacitor within the cove area and to provide a gap between the two internal leads. Above or below the gap, a bypass capacitor is mounted to the internal leads with one capacitor pole electrically connected, by way of a metal connector, or contact, to the internal power supply lead and the other pole, also by way of a metal contact, connected to the internal ground lead. This configuration can also be utilized to mount other two or three element discrete components such as transistors, oscillators or the like.

Typically, surface mount bypass capacitors are approximately 20 mils in height. If the IC package is 30 mils or less, a capacitor mounted to the internal leads has a greater height and rises above the upper or lower surface of the IC package. To avoid stackability problems when multiple ICs utilizing the bypass capacitor configuration of the present invention are used, one or more cove areas are formed at both ends of the integrated circuit package. In this configuration, bypass capacitors are mounted only in the cove areas on one end or one side of the package. The cove areas on the opposite end or side are left open to provide clearance for alternatively configured integrated circuit packages in high density stacks.

To form a high density integrated circuit package from individual IC devices of the present invention, the IC devices are stacked alternatively so an IC device has the open cove area of the IC stacked immediately above or below it to provide clearance for the IC device's bypass capacitor. This alternate vertical stacking technique eliminates interference between the bypass capacitor of each stacked IC device and improves stackability. In an alternative embodiment, two adjacent cove areas are provided on each end of the package. This configuration allows alternation between adjacent cove areas as well as end-to-end alternation.

In other embodiments, where the integrated circuit packages are thicker, or have greater vertical height than the bypass capacitors, the capacitors may be electrically connected to leads in more than one cove without the requirement to alternate locations.

In yet another embodiment, a mounting for decoupling capacitors or other two or three terminal devices is provided by extensions of the internal lead frame which project beyond the unleaded ends of the package. This configuration is well suited for high density stacks of Thin Small Outline Package, or TSOP level-one packages. If the overall TSOP level-one package height does not permit stacking with capacitors on the same ends or sides of each level-one package, the mounting extensions can be alternated from end to end, or, where applications permit, a single capacitor can be used for decoupling of two level-one packages.

To avoid solder reflow problems that arise during module assembly or when the module is soldered into a circuit board or other device, a thin, flexible, high temperature adhesive material is used to secure the capacitor to at least one of the internal leads in the cove area so when the external power and ground leads are soldered and the heat from the soldering process is transmitted through the IC package to the internal leads, the adhesive will hold the capacitor firmly in place, although the solder joints between the capacitor connectors and the internal leads may become soft or loosen completely.

Power supply capacitive decoupling is improved in the present invention since the bypass capacitor is connected to internal leads in the cove area of the IC package which situates the power supply decoupling as close as possible to the lead frame-to-die or other electrical contact interconnection points. This dramatically reduces ground bounce and provides additional improvement in the clock-to-data access time for memory IC devices.

This package features integrated power supply bypass capacitors that are attached to individually packaged ICs at the two non-leaded ends. Capacitor attachment leads are brought out of the IC package in such a way that when capacitors are attached to alternating positions, the individually packaged ICs can be stacked into modules without increasing the vertical height of the module.

This feature dramatically reduces power supply transients and ground bounce by decoupling the power leads as close as possible to the lead frame-to-die interconnection points. In addition, a second power input, such as an I/O power rail with power pins that are separate from the core IC power pins, can be decoupled with similar capacitors on the other end of the IC package. This provides similar benefits of transient reduction and reduced ground bounce for the separate I/O structure. A module assembled in this matter with integrated bypass capacitors will provide increased

DETAILED DESCRIPTION OF THE INVENTION

Figure 1:
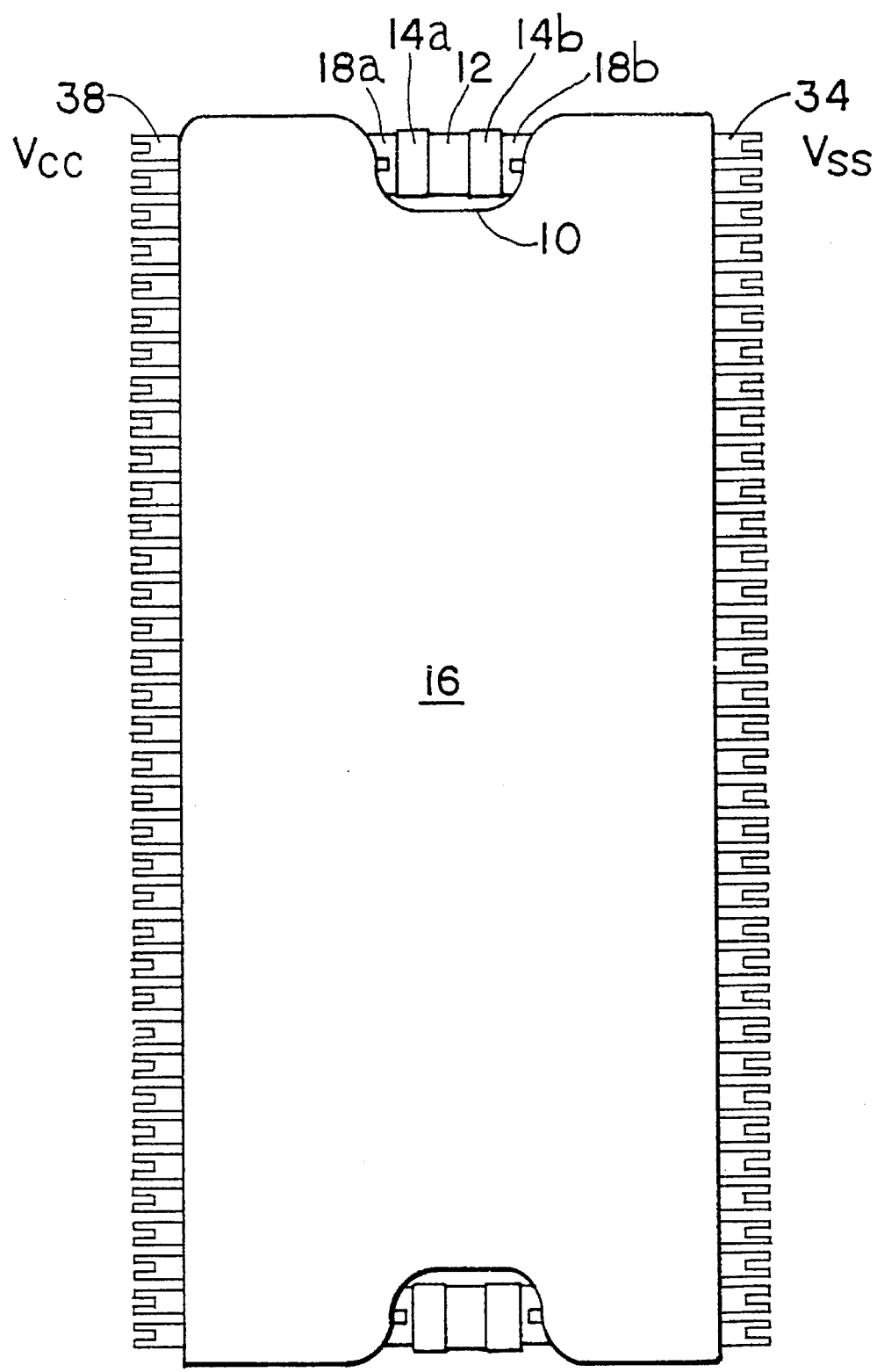
FIG. 1 is a planar view of an integrated circuit device including one embodiment of a bypass capacitor configuration of the present invention.

Referring to FIG. 1, an integrated circuit package 16 of the present invention is illustrated. Bypass capacitor 12, with contacts 14 on either pole of capacitor 12, is shown attached to internal leads 18a and 18b which extend from integrated circuit package 16 into cove 10 formed in package 16. Internal leads 18 may be multi-pronged, as shown in FIG. 1, or may have only a single prong in other embodiments.

In one embodiment, as shown in FIG. 1, power or voltage is applied to integrated circuit package 16 on external lead, or pin, 38. A second external lead 34, or pin, provides electrical ground. The present invention may also be utilized with lead-less packages. For the purpose of this invention, power or voltage supplied to the integrated circuit package 16 will be referred to as $V_{cc}$ and ground will be referred to as $V_{ss}$ or GND. In other embodiments, power and ground may be supplied to integrated circuit 16 on one or more external leads, castellations or other types of electrical connection.

Figure 4:
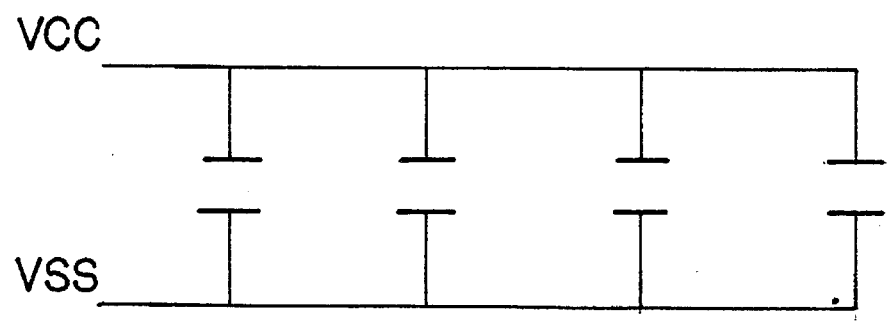
FIG. 4 is an electrical schematic diagraming power supply decoupling performed by a bypass capacitor in the configuration of the present invention.

Continuing to reference FIG. 1, an integrated circuit element or die (not shown) housed within integrated circuit package 16 is typically electrically connected to $V_{cc}$ external lead 38 and $V_{ss}$ external 34 via an electrically conductive patterned lead frame. In the present invention, $V_{cc}$ external lead 38 and $V_{ss}$ external lead 34 are also each electrically connected to separate and internal leads 18a and 18b. Leads 18a and 18b preferably extend from the internal lead frame. Bypass capacitor 12 is electrically connected via contacts 14a and 14b to internal leads 18a and 18b, respectively. In the present configuration, power supply decoupling is provided by using a bypass capacitor between $V_{cc}$ and $V_{ss}$ of integrated circuit package 16. The power supply decoupling of the present invention is shown schematically in FIG. 4. Cove 10 may be formed in either end or both ends, as shown in FIG. 1, of integrated circuit package 16.

Bypass capacitor 12 may be any of a number of commonly-available capacitors suitable for decoupling purposes and physically sized and shaped so as to fit within cove 10. Such capacitors typically include electrically conductive contacts 14 at either end or pole. Each of these contacts 14 is soldered, or otherwise electrically connected, to one of the internal leads 18. Because each of the internal leads 18 is electrically and thermally coupled to external $V_{cc}$ lead 38 or external $V_{ss}$ lead 34, respectively, heat generated while soldering either $V_{cc}$ external lead 38 or $V_{ss}$ external lead 34 to a circuit board or an external rail assembly in a stacked module is transmitted directly through package 16 to leads 18, which may cause solder reflow of the soldered joints between each capacitor contact 14 and each internal lead 18.

Figure 2A:
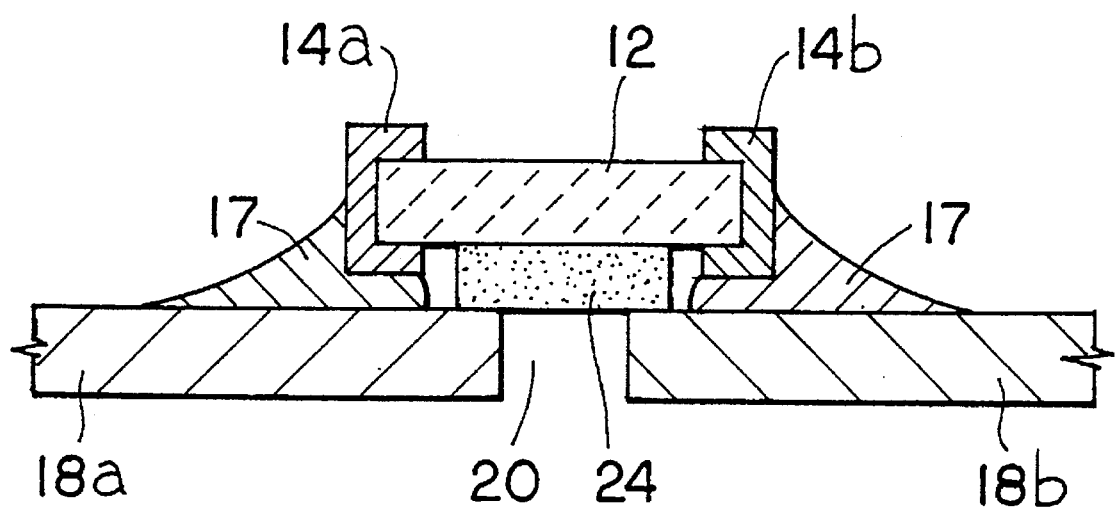
FIG. 2a is a partial cross-sectional view of one embodiment of the present invention showing bypass capacitor mounted to internal leads with adhesive material.

Referring now to FIG. 2a, an attachment procedure is illustrated which avoids solder reflow problems. Before soldering, capacitor 12 is affixed to leads 18a, 18b with a flexible, high temperature adhesive material 24. Adhesive material 24 may be applied to one or both leads 18a and 18b. Adhesive 24 may be any suitable commercially available material such as epoxy or silicon based adhesive capable of withstanding 215°– 230° C. soldering temperatures without loss of adhesion. Examples of such materials are polyimide 111-15 from Creative Materials, Inc., thin free-based film X1-5000 from Ablestik Laboratories, or XK/5022-81C from Epoxy Technology, Inc. Solder 17 completes electrical coupling between contacts 14 and leads 18. Solder filets 17 can be applied as needed.

In one embodiment, shown in FIG. 2a, adhesive material 24 is shown in contact with capacitor 12 and each internal lead 18, while bridging a gap 20 between internal leads 18. Solder fillets 17 complete electrical coupling between contacts 14 and leads 18.

Figure 2B:
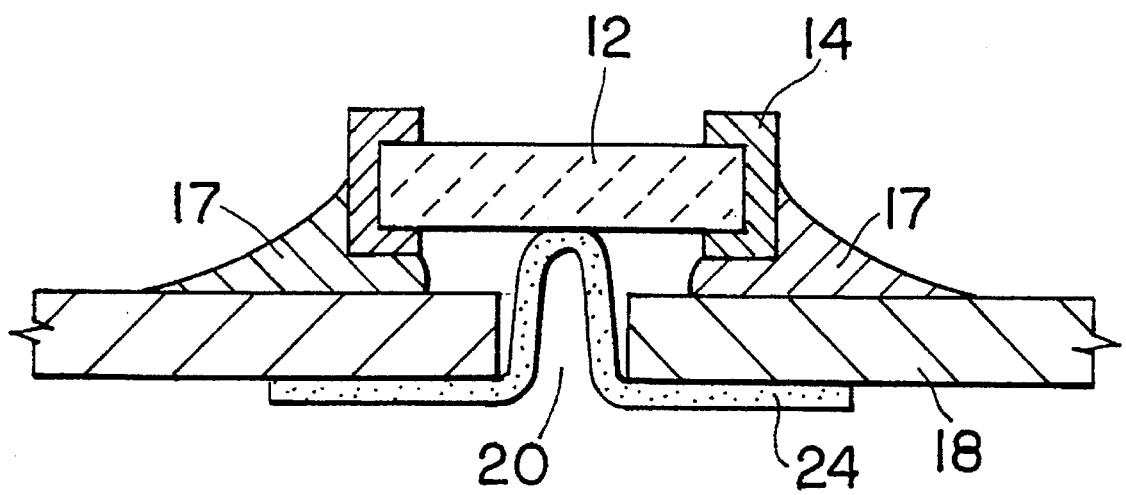
FIG. 2b is a partial cross-sectional view of an alternative embodiment including a bypass capacitor attached to internal leads with adhesive material flexed-up to contact capacitor.

In a second embodiment, shown in FIG. 2b, adhesive material 24 is applied to each internal lead 18 on the side of each internal lead 18 opposite that from where bypass capacitor 12 is mounted. A portion of adhesive material 24 is attached to one internal lead 18 and adhesive material 24 is then flexed-up into gap 20 between internal leads 18 to come into adhesive contact with bypass capacitor 12 and then fastened to the other internal lead 18.

Figure 2C:
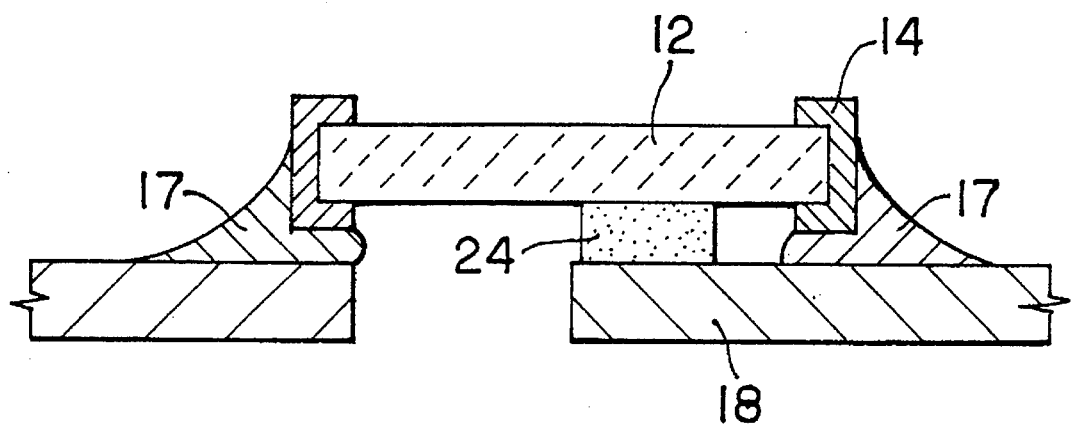
FIG. 2c is a partial cross-sectional view of bypass capacitor attached by adhesive material to only one internal lead

In a third embodiment, shown in FIG. 2c, adhesive material 24 is applied to one internal lead 18 and bypass capacitor 12 only.

Figure 2D:
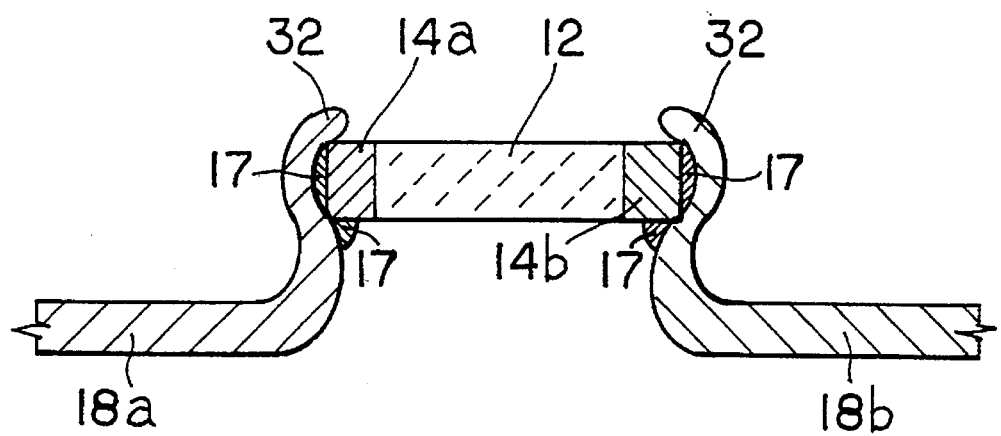
FIG. 2d is a partial cross-sectional view of an embodiment including modified internal lead ends which are adapted to receive a bypass capacitor.

In a fourth embodiment, shown in FIG. 2d, internal leads 18 have cupped ends 32 which are suitable for receiving either end of bypass capacitor 12 with its respective contact 14. In this embodiment, the capacitor 12 is mechanically bound in place by the combined action of cupped ends 32 and the resilient inward spring loading of leads 18a and 18b.

Solder 17 fills any void in cupped ends 32 and below contact ends 14a and 14b, as necessary.

Figure 3:
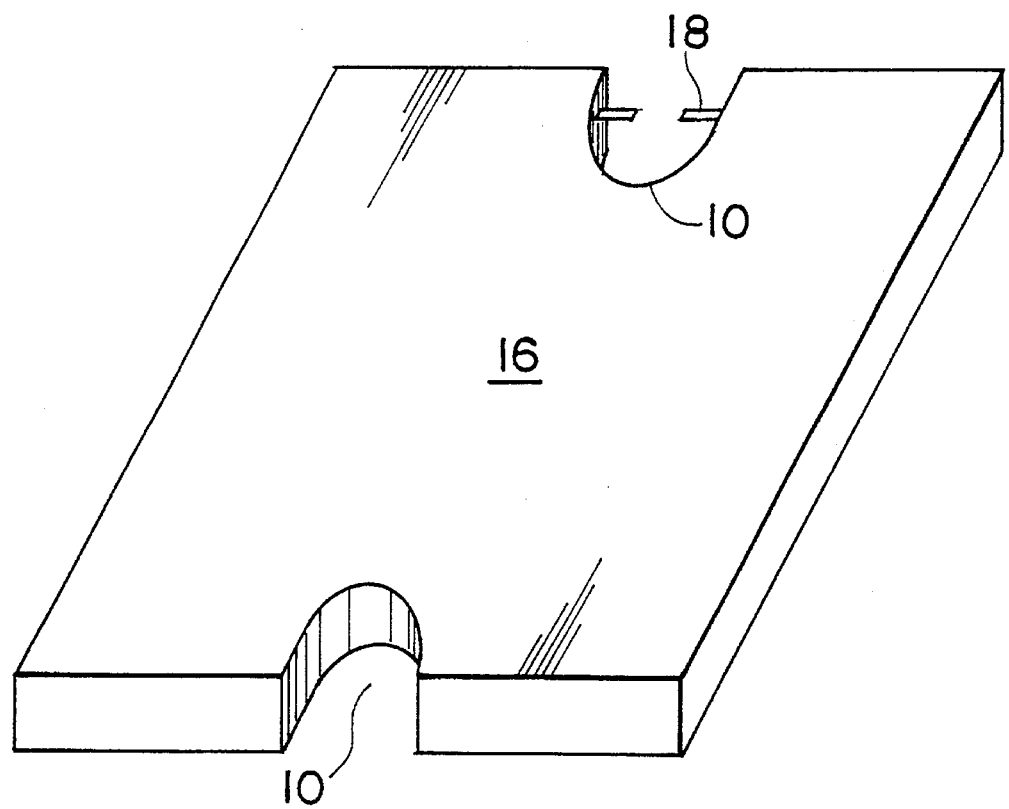
FIG. 3 is an isometric view of integrated circuit package illustrating an embodiment of the present invention having two cove areas.

FIG. 3 illustrates an embodiment of the present invention where single pronged internal leads 18 are situated within one of two cut-outs, or coves 10, in integrated circuit package 16. The cove 10 on the opposite end of package 16 contains no internal leads 18.

Figure 5:
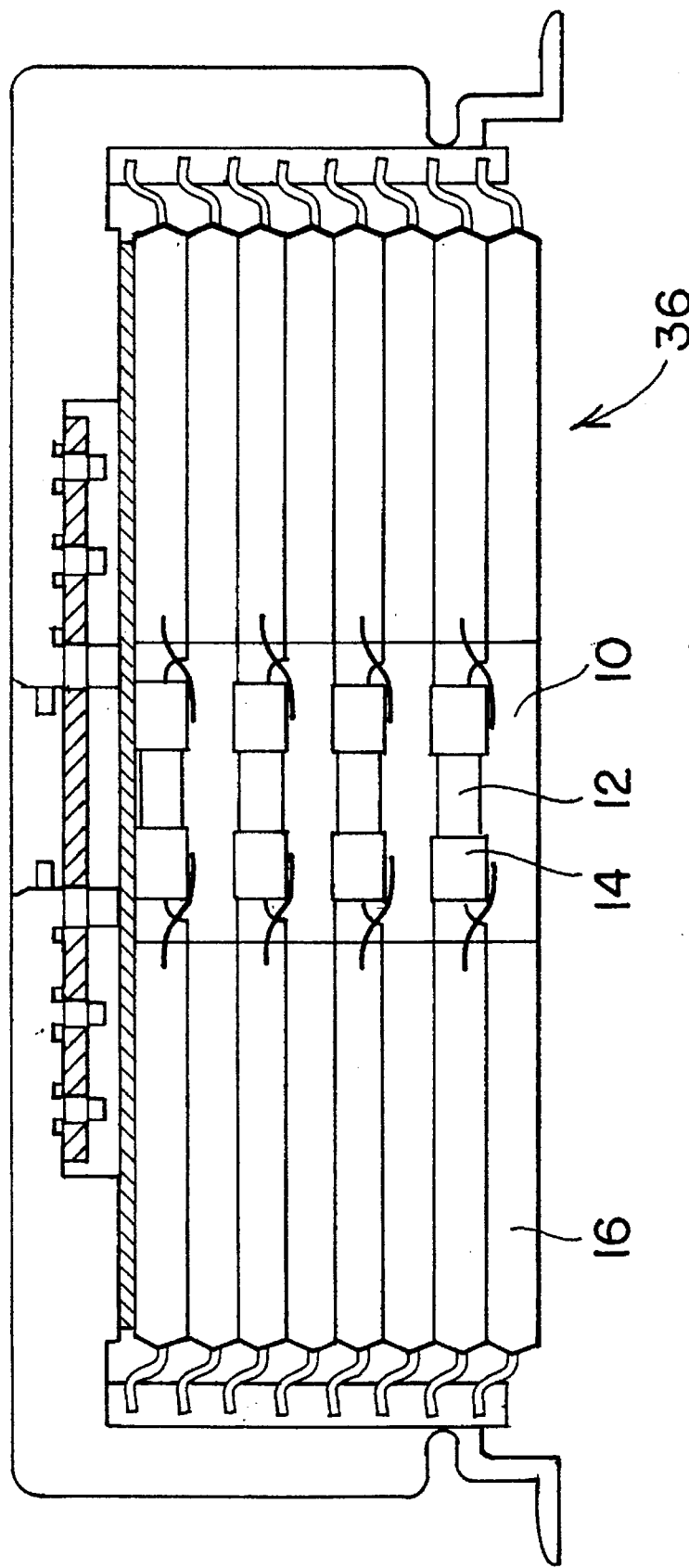
FIG. 5 is an end view of a stack of individual integrated circuit packages of the present invention to form a high density integrated circuit package.

A level-two stack, or package 36, comprised of stacked individual integrated circuit packages 16 is shown in FIG. 5. FIG. 5 depicts eight individual integrated circuit packages 16 which are stacked, alternately, one on another. Each of the eight integrated circuit packages 16 contains a single bypass capacitor 12 electrically connected to internal leads 18 (not shown) by way of contacts 14. As shown in FIG. 5, the individual integrated circuit packages 16 are stacked in alternate fashion, one above the other, so that their respective bypass capacitors 12 do not come into contact with each other. Since each integrated circuit package 16, as shown in FIG. 5, has two coves 10, only one of which contains a bypass capacitor 12, the empty cove 10 of each integrated circuit package 16 provides clearance space so that an integrated circuit package 16 stacked immediately above or below the open cove 10 can protrude into the open cove 10 without interfering with or coming into contact with another bypass capacitor 12.

Figure 6A:
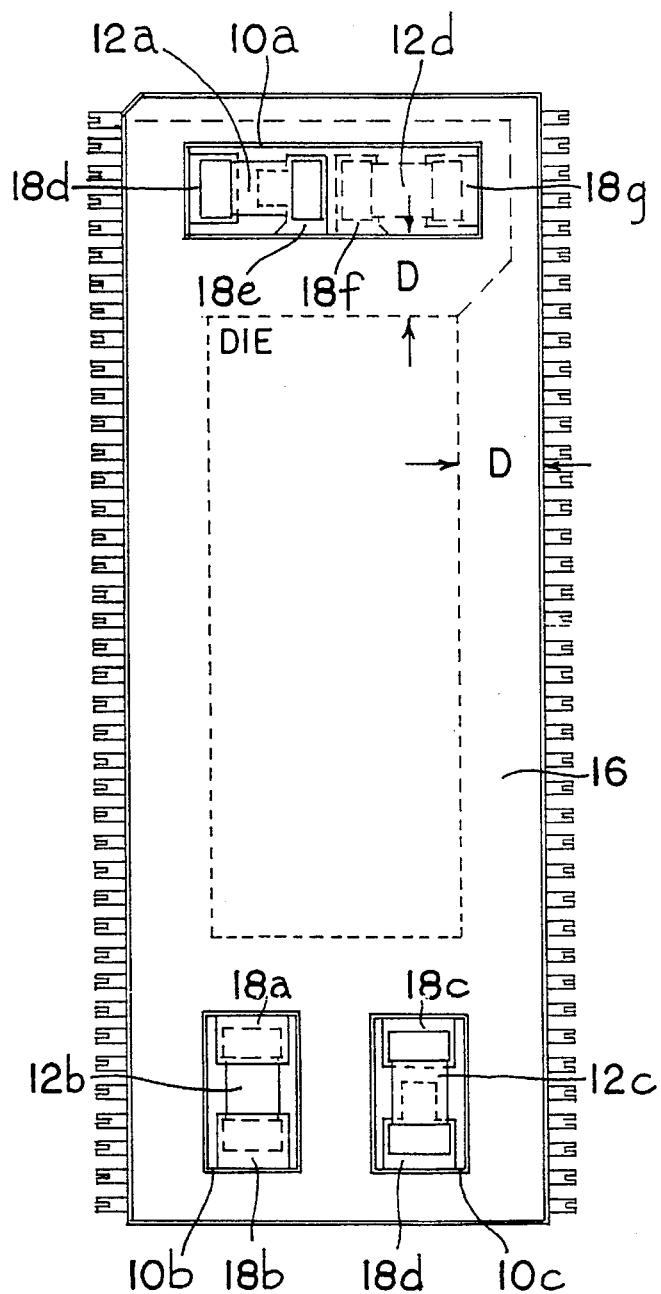
FIG. 6a and 6b are a planar and edge view of alternative embodiments of the present invention wherein multiple adjacent cove areas are provided on each end of the integrated circuit packages.

Referring now to FIG. 6, other embodiments of the present invention are illustrated. In these embodiments, integrated circuit package 16 is formed having one or more apertures 10 formed in either or both unleaded ends. Apertures 10 are formed as an elongated rectangular hole through the transfer molded casing of package 16. These apertures 10 are preferably formed during the molding process but could be formed afterwards by die-cutting, stamping, laser cutting or otherwise removing the necessary material.

In these embodiments, multiple capacitors 12 can be mounted, in the manner described above, on alternate sides of package 16, as well as on alternate ends to accommodate stacking. For example, at the bottom of FIG. 6a, capacitor 12b (shown in phantom) is mounted on the underside of leads 18a and 18b, while capacitor 12c overlays leads 18c and 18d.

Figure 6B:
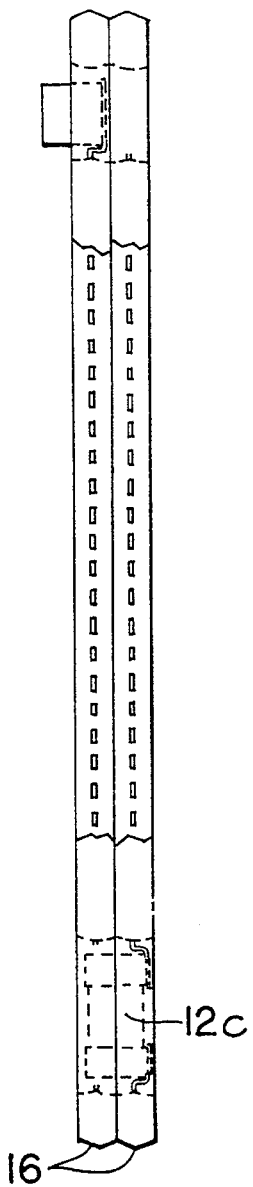

Package 16 can alternatively be formed with a single, larger aperture 10a (FIG. 6a), wherein two sets of leads 18d through 18g extend to receive two capacitors 12a and 12d. To facilitate stacking, capacitors 12a and 12d are mounted on opposite sides of leads 18. Packages 16 to be mounted stacked above or below each other have capacitors 12a, 12d mounted in an inverse relationship relative to leads 18, as shown in FIG. 6b.

In this and other embodiments, it is important that coves or apertures 10 be formed to maintain distance D (FIG. 6) between aperture 10 and the integrated circuit die greater than the minimum distance necessary to preserve hermeticity and structural integrity. The distance D can vary since moisture penetration depends on materials and the manner in which the die is encapsulated and the manner in which the inner lead frame or other features relate to apertures 10. This distance D is typically in the range of 25 to 35 mils.

In all embodiments, in addition to a suitable adhesive material, capacitors 12 can be further protected and adhered by applying a conformal coating over the capacitors and contacts after mounting. A suitable coating may be one of any commonly-available silicone elastomer which are pourable, yet cure at room temperature, and which endure high temperatures (250° C.) after curing. One such material is McGham Nusil Corporation's NuSil R-2186.

Figure 8:
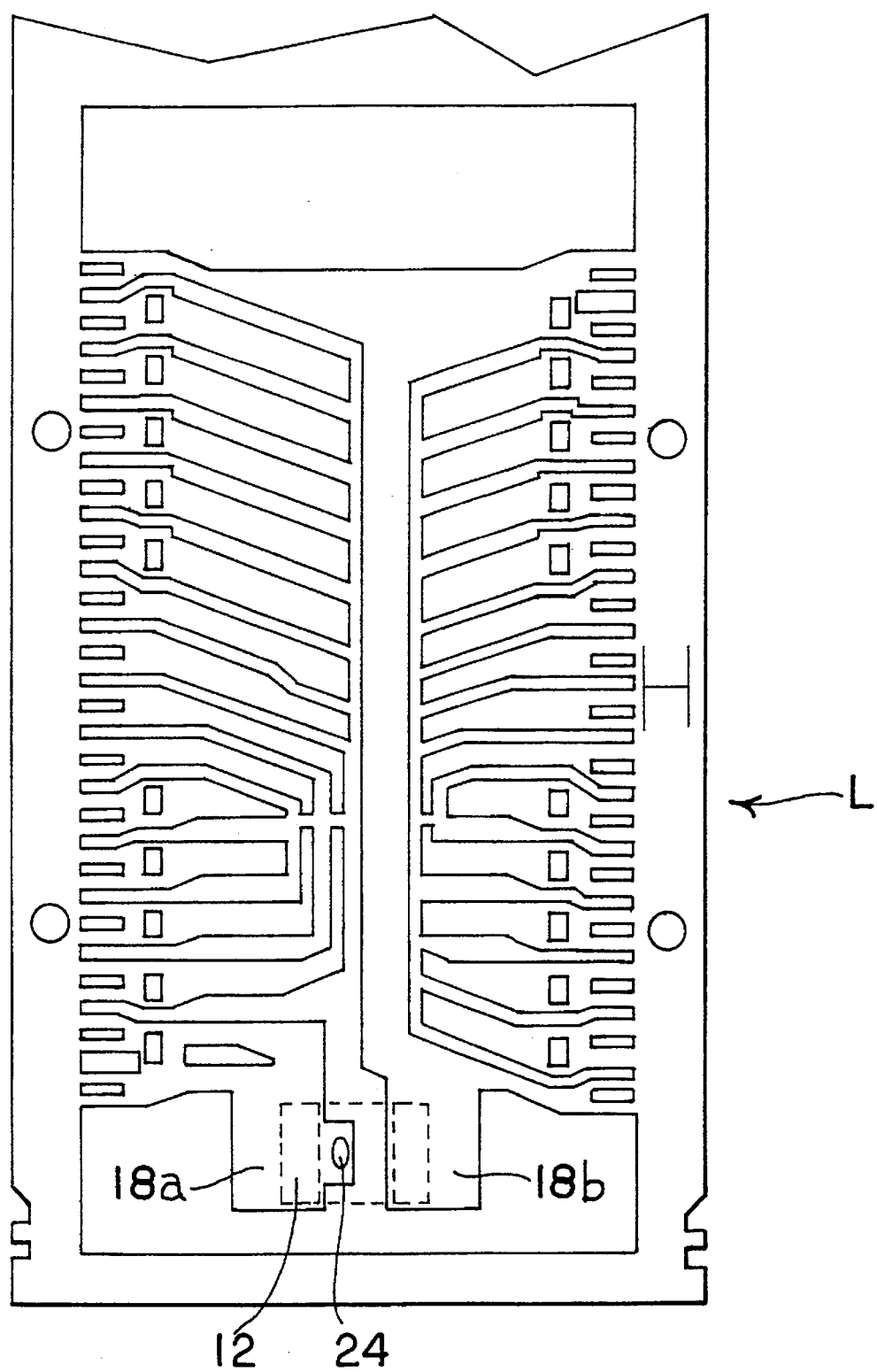
FIG. 8 is a planar view of a lead frame having extensions to provide a mounting for a capacitor or other discrete component.

Referring now to FIG. 8, a lead frame L having lead extensions 18a and 18b is illustrated. Capacitor 12 is adhered by adhesive 24 to one or both leads 18a or 18b. Package 16 (not shown) is then manufactured by attaching frame L to an integrated circuit die and applying a molded casing surrounding the die, lead frame L and capacitor 12. Alternatively, the lead frame and die can be assembled and the casing molded with a suitable cut out or cove overlaying leads 18a an 18b to receive capacitor 12 after the molding process is complete.

Figure 7B:
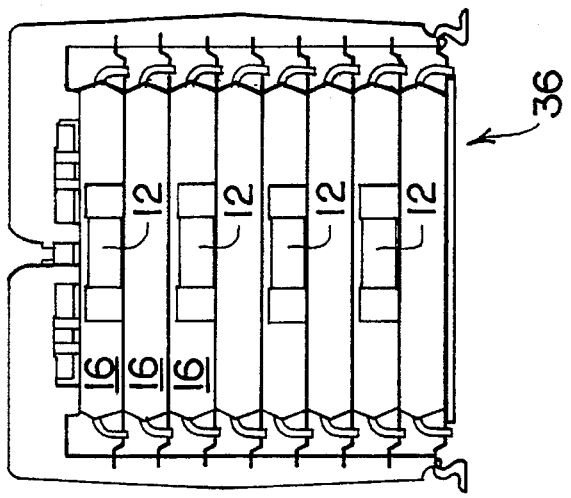
FIGS. 7a and 7b are top and end views of alternative embodiments of the present invention, wherein a mounting for the capacitors is provided by an extension of the lead frames beyond the non-leaded ends of the IC packages.
Figure 7A:
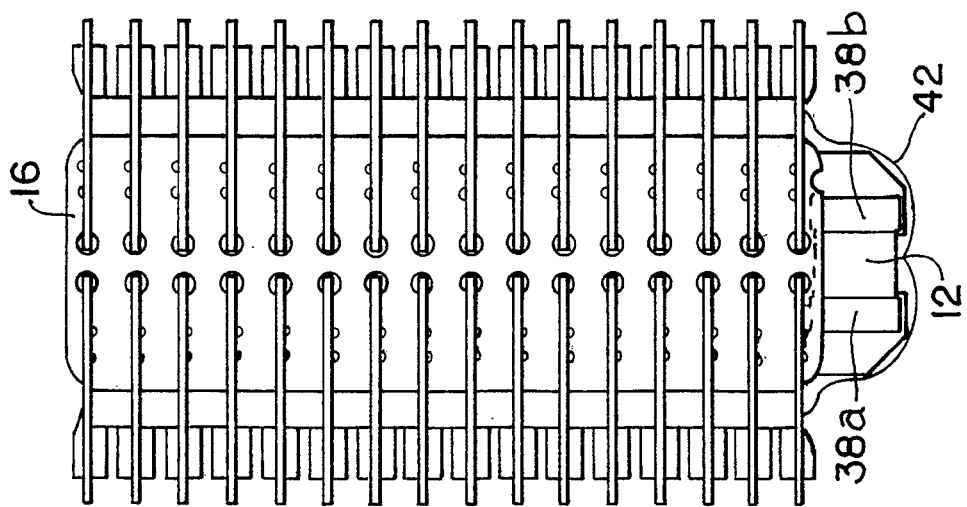

FIGS. 7a and 7b illustrate a further embodiment of the present invention. In this embodiment, lead frames such as those shown in FIG. 8 are adapted to have extensions 38a and 38b which project from the unleaded ends of individual level-one packages 16. As shown in FIG. 7b, capacitors 12 are provided on alternating levels of stack 36 to provide decoupling for every other level. This alternating scheme also provides extra head room for capacitors 12 where necessary. If desired, additional capacitors 12 can be provided on the opposite unleaded end of stack 36 on those level-one packages 16 not shown having extensions 38 and capacitors 12 in FIG. 7b. A conformal coating 42, similar to that described elsewhere herein, is applied around the perimeter of capacitor 12, leads 38a and 38b and in contact with the unleaded end of package 16 to protect capacitor 12 from damage and provide a sealant.

The present invention, therefore, is well adapted to carry out the objects and attain the ends and advantages mentioned herein as well as other ends and advantages made apparent from the disclosure. While preferred embodiments of the invention have been described for the purpose of disclosure, numerous changes and modifications to those embodiments described herein will be readily apparent to those skilled in the art and are encompassed within the spirit of the invention and the scope of the following claims.

What is claimed is:

1. An integrated circuit package adapted to include capacitive decoupling, said package comprising:

(a) an integrated circuit element contained within an integrated circuit casing; wherein said casing has an upper surface, a lower surface and a perimeter wall;

(b) said casing having an aperture formed therein, the aperture extending completely through said casing upper and lower surface and being adapted to partially receive a discrete electrical circuit element; and (c) a first and second electrical lead, each extending from said integrated circuit element through a portion of said casing and into said aperture.

2. The package of claim 1, further comprising: a discrete electrical circuit component electrically coupled to said first and said second leads, said discrete component being partially received within the aperture.

3. The package of claim 1, wherein said first lead is electrically connected to a power supply input for said integrated circuit element and said second lead is electrically connected to a ground input for said integrated circuit element.

4. The package of claim 2, wherein said discrete component comprises a capacitor.

5. The package of claim 2, wherein said discrete component is attached to said first or second lead with a flexible, high temperature adhesive material.

6. The package of claim 5, wherein said adhesive material comprises an adhesive sheet.

7. The package of claim 5, wherein said adhesive material comprises a double-sided adhesive sheet.

8. The package of claim 5, wherein said adhesive material is capable of withstanding solder reflow temperatures without deteriorating significantly or failing to adhere to either said capacitor or said first or second leads.

9. The package of claim 5, wherein said adhesive material comprises a high temperature epoxy capable of withstanding solder reflow temperatures without deteriorating significantly or failing to adhere to either said capacitor or said first or second leads.

10. The package of claim 5, wherein said discrete component, having two poles, further has a metal contact electrically connected to each said pole of said capacitor.

11. The package of claim 5, wherein said adhesive material is situated between said discrete component and each of said first and second leads so that said material spans a gap formed between said leads.

12. The package of claim 5, wherein said adhesive material is situated between said discrete component and either said first or said second lead.

13. The package of claim 5, wherein said adhesive material is attached to said first and said second internal leads and is flexed into a gap formed between said leads so that said material comes into adhesive contact with said discrete component.

14. The package of claim 10, wherein said first and said second leads have cupped ends for receiving said discrete component contacts.

15. The package of claim 14, wherein said adhesive material is situated essentially between said cupped ends of each of said first and second leads and the component contact received by the respective said cupped end.

16. An integrated circuit package including capacitive decoupling of said package, comprising:
    (a) an integrated circuit element contained within an integrated circuit casing; wherein said casing has an upper surface, a lower surface and a perimeter wall;
    (b) said casing having a plurality of coves, each formed in a portion of said perimeter wall, wherein said coves extend through said upper and lower casing surfaces;
    (c) a first and second electrical lead each extending from said integrated circuit element through said casing perimeter wall and into at least one of said coves; and
    (d) a bypass capacitor electrically connected to both said first and said second internal leads.

17. The package of claim 16, wherein said capacitor is attached to said first or second lead with a flexible, high temperature adhesive material.

18. The package of claim 16, wherein said capacitor is a bypass capacitor which provides power supply decoupling for said integrated circuit element.

19. The package of claim 16, wherein said first and second leads are essentially planar with respect to each other.

20. The package of claim 17, wherein said adhesive material comprises an adhesive sheet.

21. The package of claim 17, wherein said adhesive material comprises a double-sided adhesive sheet.

22. The package of claim 17, wherein said material is capable of withstanding solder reflow temperatures without deteriorating significantly or failing to adhere to either said capacitor or said first or second leads.

23. The package of claim 17, wherein said adhesive material comprises a high temperature epoxy capable of withstanding solder reflow temperatures without deteriorating significantly or failing to adhere to either said capacitor or said first or second leads.

24. The package of claim 17, wherein said capacitor, having two poles, further has a metal contact electrically connected to each said pole of said capacitor.

25. The package of claim 17, wherein said adhesive material is situated between said capacitor and each of said first and second leads so that said material spans a gap formed between said leads.

26. The package of claim 17, wherein said adhesive material is situated between said capacitor and either said first or said second lead.

27. The package of claim 17, wherein said adhesive material is attached to said first and said second leads and is flexed into a gap formed between said leads so that said material comes into adhesive contact with said capacitor.

28. The package of claim 24, wherein each said contact is made of copper.

29. The package of claim 24, wherein one of said contacts is electrically connected to either said first or second lead and said other contact is electrically connected to said other first or second lead.

30. The package of claim 24, wherein said first and said second leads have cupped ends for receiving said capacitor contacts.

31. The package of claim 30, wherein said adhesive material is situated essentially between said cupped ends of each of said first and said second leads and the capacitor contact received by the respective said cupped end.

32. An integrated circuit package suitable for capacitive decoupling said package, comprising:
    (a) an integrated circuit element contained within an integrated circuit casing; wherein said casing has an upper surface, a lower surface and a perimeter wall;
    (b) said casing having at least one cove formed in said perimeter wall, wherein said at least one cove extends through said upper and lower casing surfaces;
    (c) a pair of electrical leads, each of said leads extending from said integrated circuit element through said casing perimeter wall and into at least one of said coves; wherein said pair of leads are suitable for mounting a bypass capacitor.

33. A level-two high density integrated circuit package including capacitive decoupling of said package, comprising:
    a plurality of level-one integrated circuit packages, wherein each level-one package comprises:
    (a) an integrated circuit element contained within an integrated circuit casing; wherein said casing has an upper surface, a lower surface and a perimeter wall;
    (b) said casing having an aperture formed therein, said aperture extending through said upper and lower casing surface, said aperture being adapted to receive a decoupling capacitor; and
    (c) a pair of electrical leads, comprising a first and a second electrical lead, each of said leads extending from said integrated circuit element through a portion of said casing and into said aperture; said pair of leads being adapted for mounting a bypass capacitor thereon;
    and wherein said level-two package is comprised of a plurality of said level-one integrated circuit packages stacked with decoupling capacitors mounted on alternating opposite ends of said level-one packages.

34. The level-two package of claim 33, wherein each said level-one package has a plurality of apertures, wherein one said aperture is formed on a first end of said casing and a second said aperture is formed on a second and opposite end of said casing of each said level-one package; and wherein at least one of said apertures has a first and a second electrical lead extending therein; and wherein at least one other said aperture has no electrical leads extending therein.

35. An integrated circuit package adapted for capacitive decoupling, said package comprising:
  (a) an integrated circuit element contained within an integrated circuit casing, said casing having an upper surface, a lower surface and a perimeter wall; said casing being generally rectangular having a first and second end, and first and second sides, said sides being longer than said ends;
  (b) said casing further having a first and a second aperture formed adjacent one another near one of said casing ends, each of said apertures being formed to receive a decoupling capacitor therein; and
  (c) a first and a second internal electrical lead, said leads being electrically coupled to said integrated circuit element within said casing; said internal leads extending partially into one of said apertures to provide electrical coupling and support for a decoupling capacitor.

36. An integrated circuit package comprising:
  (a) an integrated circuit element contained within an integrated circuit casing, said casing having an upper surface, a lower surface and a perimeter wall;
  (b) a lead frame electrically coupled to said integrated circuit element, said lead frame having a first and a second electrically conductive extension, said extensions protruding through a portion of said casing perimeter wall; said extensions being electrically coupled to power and ground sources for said integrated circuit element;
  (c) a decoupling capacitor mounted to said first and second conductive extensions; and
  (d) wherein said capacitor is mounted to at least one of said extensions with an adhesive.

37. The package of claim 36, wherein said capacitor and said extension are encapsulated with an external conformal coating.

* * * * *

UNITED STATES PATENT AND TRADEMARK OFFICE
CERTIFICATE OF CORRECTION

PATENT NO. : 5,498,906
DATED : March 12, 1996
INVENTOR(S) : Roane, et al.

It is certified that error appears in the above-indentified patent and that said Letters Patent is hereby corrected as shown below:

Column 1, line 10, between "to" and "apparatus", insert therebetween -- an -- .

Column 3, line 19, between "of" and "bypass", insert therebetween -- a -- .

Column 3, line 20, after "lead", insert -- ; -- .

Column 4, line 44, delete "filets" and insert therefor -- fillets -- .

Column 6, line 39, between "within" and "an", insert therebetween -- and covered by -- .

Column 7, line 32, between "within" and "an", insert therebetween -- and covered by -- .

Column 8, line 43, between "within" and "an", insert therebetween -- and covered by -- .

Column 9, line 3, between "within" and "an", insert therebetween -- and covered by -- .

Column 10, line 1, between "within" and "an", insert therebetween -- and covered by -- .

Signed and Sealed this

Tenth Day of September, 1996

Attest:

BRUCE LEHMAN

*Attesting Officer*     *Commissioner of Patents and Trademarks*